United States Patent
Cho

(10) Patent No.: US 10,329,669 B2
(45) Date of Patent: Jun. 25, 2019

(54) DEPOSITION APPARATUS AND DEPOSITION METHOD

(71) Applicant: ASM IP Holding B.V., Almere (NL)

(72) Inventor: Hyun-Kyu Cho, Daejeon (KR)

(73) Assignee: ASM IP HOLDING B.V., Almere (NL)

( * ) Notice: Subject to any disclaimer, the term of this patent is extended or adjusted under 35 U.S.C. 154(b) by 539 days.

(21) Appl. No.: 15/187,879

(22) Filed: Jun. 21, 2016

(65) Prior Publication Data

US 2016/0298238 A1     Oct. 13, 2016

Related U.S. Application Data

(62) Division of application No. 13/751,282, filed on Jan. 28, 2013, now Pat. No. 9,399,819.

(30) Foreign Application Priority Data

Jan. 30, 2012    (KR) .................. 10-2012-0008739

(51) Int. Cl.
| | |
|---|---|
| *C23C 16/513* | (2006.01) |
| *C23C 16/52* | (2006.01) |
| *C23C 16/455* | (2006.01) |
| *H01J 37/32* | (2006.01) |

(52) U.S. Cl.
CPC ...... *C23C 16/513* (2013.01); *C23C 16/45536* (2013.01); *C23C 16/52* (2013.01); *H01J 37/32082* (2013.01); *H01J 37/32174* (2013.01); *H01J 37/32899* (2013.01)

(58) Field of Classification Search
CPC ................................................ H01J 37/32899
See application file for complete search history.

(56) References Cited

FOREIGN PATENT DOCUMENTS

| | | |
|---|---|---|
| JP | H08-008096 | 1/1996 |
| KR | 10-0210433 | 7/1999 |
| KR | 10-2001-0064947 | 7/2001 |
| KR | 10-2010-0089642 | 8/2010 |

*Primary Examiner* — Parviz Hassanzadeh
*Assistant Examiner* — Nathan K Ford
(74) *Attorney, Agent, or Firm* — Lex IP Meister, PLLC

(57) ABSTRACT

A deposition apparatus according to an exemplary embodiment of the present invention includes a plurality of reactors; a plurality of gas supply units connected to the plurality of reactors; and a plurality of plasma supply units connected to the plurality of reactors. Each of the plasma supply units includes: a plasma power supplier; a plurality of diodes connected to the plasma power supplier; and a reverse voltage driver connected to the plurality of diodes through respectively corresponding switches.

8 Claims, 4 Drawing Sheets

DEPOSITION APPARATUS AND DEPOSITION METHOD

CROSS-REFERENCE TO RELATED APPLICATION

This application is a Divisional Application of U.S. patent application Ser. No. 13/751,282 filed on Jan. 28, 2013, now U.S. Pat. No. 9,399,819, which claims priority to and the benefit of Korean Patent Application No. 10-2012-0008739 filed in the Korean Intellectual Property Office on Jan. 30, 2012, the entire contents of which are incorporated herein by reference.

BACKGROUND OF THE INVENTION (a) Field of the Invention

The present invention relates to a deposition apparatus and a deposition method.

(b) Description of the Related Art

Recently, many efforts have been made for mass production in a semiconductor process. Particularly, since an atomic layer deposition (ALD) process has a problem of low throughput, a variety of attempts have been made to overcome that problem. For example, a batch-type chamber was introduced in which a plurality of substrates are mounted vertically. Another type of chamber includes a plurality of single wafer processing reactors therein. In the latter case, a multi-reactor chamber developed by ASM Genitech Korea Ltd. is released and in use commercially, and is also disclosed in detail in Korean Patent No. 782529. The multi-reactor chamber has a plurality of single wafer reactors inside of it, but each of the reactors is individually controlled. Therefore, the multi-reactor chamber can achieve mass productivity and precise control over each substrate, which cannot be achieved in conventional batch-type apparatuses.

Recently, as the critical dimension (CD) of device circuits gradually decreases, demand for a low temperature process has increased, and much attention has been paid to a plasma enhanced atomic layer deposition (PEALD) process of which the existing conventional thermal ALD process and a plasma process are combined. The basic patent of the PEALD process has been described in detail in Korean Patent No. 273473 filed by ASM Genitech Korea Ltd. Recently, in order to accomplish mass production of the PEALD process, the plasma process has been applied to the multi-reactor chamber. In general, a radio frequency (RF) generator and a matching box are applied to each reactor one by one. However, a plurality of RF generators and matching boxes that are used lead to high cost. Further, in order to obtain the uniform characteristics during a deposition process performed on a plurality of substrates, plasma power supplied to each substrate needs to be precisely controlled.

In order to supply plasma power to each reactor, a vacuum relay which is commercially on sale may be applied. In the case of the vacuum relay, however, the plasma power may not be uniformly supplied, due to a short lifetime, frequent contact failures and the like.

The above information disclosed in this Background section is only for enhancement of understanding of the background of the invention and therefore it may contain information that does not form the prior art that is already known in this country to a person of ordinary skill in the art.

SUMMARY OF THE INVENTION

The present invention has been made in an effort to provide a deposition apparatus and a deposition method, which are capable of supplying uniform RF power to a plurality of individual reactors.

An exemplary embodiment of the present invention provides a deposition apparatus including a plurality of reactors; a plurality of gas supply units connected to the plurality of reactors; and a plurality of plasma supply units connected to the plurality of reactors. Each of the plasma supply units includes: a plasma power supplier; a plurality of diodes connected to the plasma power supplier; and a reverse voltage driver connected to the plurality of diodes through switches, respectively.

The deposition apparatus may further include a plurality of equivalent circuits connected between the plasma power supplier and the plurality of diodes, respectively.

The plurality of equivalent circuits may include $\lambda/4$ equivalent circuits, respectively.

The deposition apparatus may further include a channel selector configured to control the connections between the reverse voltage driver and the plurality of diodes.

The channel selector may be driven to alternately connect the reverse voltage driver to the plurality of diodes.

The plurality of reactors may include a first reactor, a second reactor, a third reactor, and a fourth reactor; the plurality of gas supply units may include a first gas supply unit connected to the first and third reactors and a second gas supply unit connected to the second and fourth reactors; and the plurality of plasma supply units may include a first plasma supply unit connected to the first and second reactors and a second plasma supply unit connected to the third and fourth reactors.

Another exemplary embodiment of the present invention provides a deposition method including steps of: (a) preparing a deposition apparatus including a plurality of reactors including first to fourth reactors, a plurality of gas supply units including a first gas supply unit connected to the first and third reactors and a second gas supply unit connected to the second and fourth reactors, and a plurality of plasma supply units including a first plasma supply unit connected to the first and second reactors and a second plasma supply unit connected to the third and fourth reactors; (b) supplying source gas to the first and third reactors through the first gas supply unit; (c) supplying reactant gas to the first and third reactors through the first gas supply unit, and supplying source gas to the second and fourth reactors through the second gas supply unit; (d) applying a reverse voltage to a first diode of the first plasma supply unit connected to the first reactor to supply plasma power to the first reactor, and applying a reverse voltage to a third diode of the second plasma supply unit connected to the third reactor to supply plasma power to the third reactor; (e) supplying source gas to the first and third reactors through the first gas supply unit and supplying reactant gas to the second and fourth reactors through the second gas supply unit; and (f) applying a reverse voltage to a second diode of the first plasma supply unit connected to the second reactor to supply plasma power to the second reactor, and applying a reverse voltage to a fourth diode of the second plasma supply unit connected to the fourth reactor to supply plasma power to the fourth reactor.

The reactant gas may include reactive purge gas, and the step (b) may also include supplying the reactive purge gas.

The steps (c) to (f) may be repeated a plurality of times.

The method may further include supplying purge gas at one or more of between the steps (b) and (c), between the steps (c) and (d), between the steps (d) and (e), and between the steps (e) and (f).

The reactant gas may include reactive purge gas, and the reactive purge gas may be continuously supplied from the step (c) to the step (f).

The first plasma supply unit may further include a plasma power supplier and first and second equivalent circuits connected between the plasma power supplier and the first and second diodes, respectively; the second plasma supply unit may further include third and fourth equivalent circuits connected between the plasma power supplier and the third and fourth diodes, respectively; and the step (d) may further include converting a wavelength of power applied to the plasma power supplier into $\lambda/4$ through the first equivalent circuit before applying the reverse voltage to the first diode, and converting a wavelength of power applied to the plasma power supplier into $\lambda/4$ through the third equivalent circuit before applying the reverse voltage to the third diode.

The step (f) may include converting a wavelength of power applied to the plasma power supplier into $\lambda/4$ through the second equivalent circuit before applying the reverse voltage to the second diode, and converting a wavelength of power applied to the plasma power supplier into $\lambda/4$ through the fourth equivalent circuit before applying the reverse voltage to the fourth diode.

According to the exemplary embodiments of the present invention, it is possible to stably and uniformly supply RF plasma power to a plurality of individual reactors for a longer time than when an existing vacuum relay is used. Further, the diodes may be used to implement switching speed which is about 40 times faster than that of the existing vacuum relay, which makes it possible to improve a throughput in the (plasma enhanced) ALD process.

DETAILED DESCRIPTION OF THE EMBODIMENTS

Figure 1:
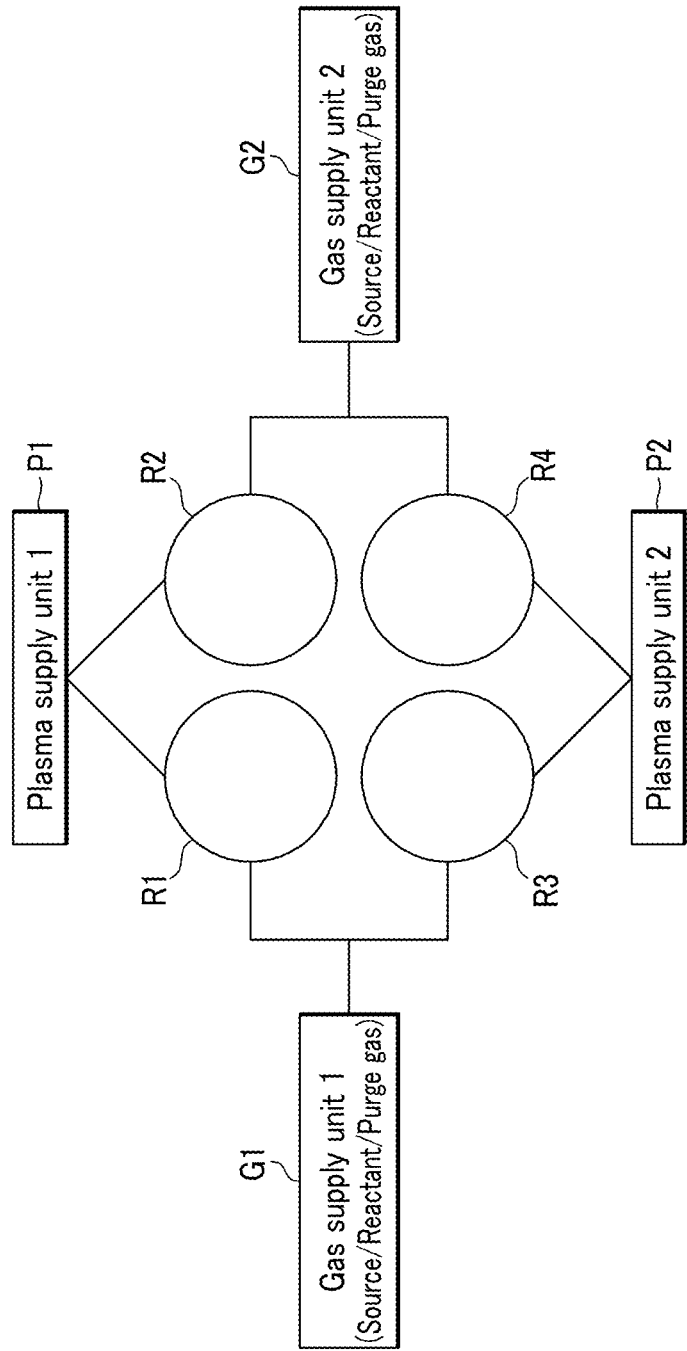
FIG. 1 is a schematic view of a deposition apparatus according to an exemplary embodiment of the present invention.

The present invention will be described more fully hereinafter with reference to the accompanying drawings, in which exemplary embodiments of the invention are shown. As those skilled in the art would realize, the described embodiments may be modified in various different ways, all without departing from the spirit or scope of the present invention.

In the drawings, the thickness of layers, films, panels, regions, etc., are exaggerated for clarity. Like reference numerals designate like elements throughout the specification. It will be understood that when an element such as a layer, film, region, or substrate is referred to as being "on" another element, it can be directly on the other element or intervening elements may also be present. In contrast, when an element is referred to as being "directly on" another element, there are no intervening elements present.

Then, referring to FIG. 1, a deposition apparatus according to an exemplary embodiment of the present invention will be described. FIG. 1 is a schematic view of the deposition apparatus according to the exemplary embodiment of the present invention.

Referring to FIG. 1, the deposition apparatus according to the exemplary embodiment of the present invention includes a plurality of reactors R1 to R4, a plurality of plasma supply units P1 and P2, and a plurality of gas supply units G1 and G2. Each of the reactors R1 to R4 may include a substrate mounted therein, on which a deposition process is to be performed. The plurality of reactors R1 to R4 includes a first reactor R1, a second reactor R2, a third reactor R3, and a fourth reactor R4. The plurality of plasma supply units P1 and P2 includes a first plasma supply unit P1 and a second plasma supply unit P2, and the plurality of gas supply units G1 and G2 includes a first gas supply unit G1 and a second gas supply unit G2.

FIG. 1 illustrates that the first and second reactors R1 and R2 are connected to the first plasma supply unit P1, and the third and fourth reactors R3 and R4 are connected to the second plasma supply unit P2. The first and third reactors R1 and R3 are connected to the first gas supply unit G1, and the second and fourth reactors R2 and R4 are connected to the second gas supply unit G2.

Therefore, the first gas supply unit G1 may supply gas to the first and third reactors R1 and R3 at the same time, and the second gas supply unit G2 may supply gas to the second and fourth reactors R2 and R4 at the same time. Each of the gas supply units G1 and G2 may include a gas supply controller such as a valve, and source gas, reactant gas, and purge gas may be alternately or selectively supplied to two reactors R1 and R3 or R2 and R4 through the gas supply controller.

Further, the first plasma supply unit P1 may supply plasma power to the first and second reactors R1 and R2, and the second plasma supply unit P2 may supply plasma power to the third and fourth reactors R3 and R4.

The reactors R1 to R4 are plasma (atomic layer) deposition reactors. The type of reactors is not limited, but all types of plasma (atomic layer) deposition reactors may be applied.

Figure 2:
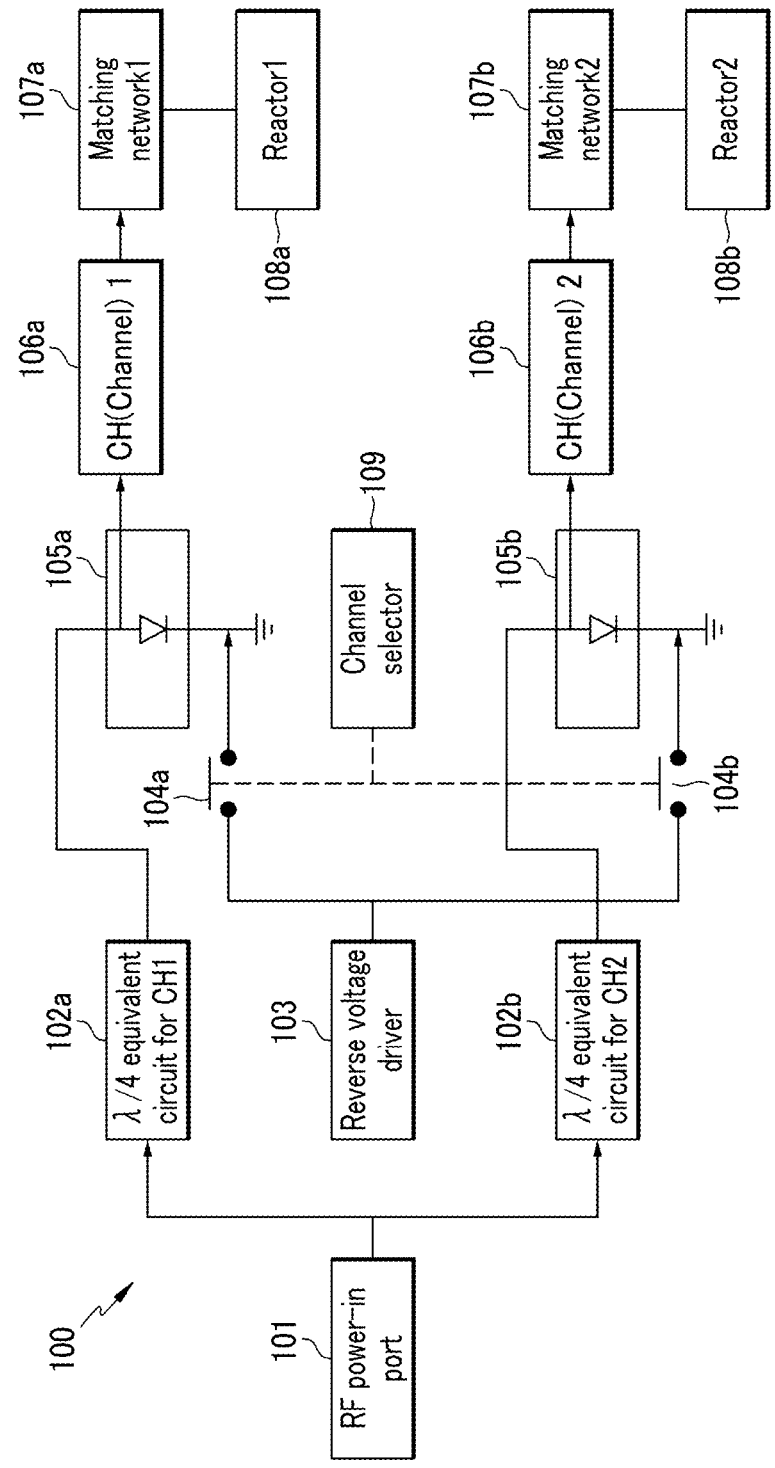
FIG. 2 is a circuit diagram of a plasma supply unit of the deposition apparatus according to the exemplary embodiment of the present invention.

Now, referring to FIG. 2, the plasma supply unit of the deposition apparatus according to the exemplary embodiment of the present invention will be described. FIG. 2 is a circuit diagram of the plasma supply unit of the deposition apparatus according to the exemplary embodiment of the present invention.

Referring to FIG. 2, the plasma supply unit 100 according to the exemplary embodiment of the present invention includes a plasma power supplier 101 such as an RF power-in port, a plurality of equivalent circuits 102a and 102b connected to the plasma power supplier 101, a reverse voltage driver 103, a plurality of diodes 105a and 105b connected to the equivalent circuits 102a and 102b, a plurality of channels 106a and 106b connected to the plurality of diodes 105a and 105b, a plurality of matching networks 107a and 107b connected to the plurality of channels 106a and 106b, a channel selector 109 connected to the reverse voltage driver 103, and a plurality of switches 104a and 104b for switching between the reverse voltage driver 103 and the channel selector 109. The channels 106a and 106b and the matching networks 107a and 107b are connected to reactors 108a and 108b, respectively.

The equivalent circuits 102a and 102b may be $\lambda/4$ equivalent circuits. The $\lambda/4$ equivalent circuit converts a wavelength of power supplied from the plasma power supplier 101 into $\lambda/4$, thereby forming zero or infinite ($\infty$) impedance in each of the channels 106a and 106b connected to the diodes 105a and 105b.

When a reverse voltage is supplied to any one of the diodes 105a and 105b through the channel selector 109 connected to the reverse voltage driver 103, the impedance of the channel 106a or 106b connected to the diode 105a or 105b becomes '0', and plasma power is supplied to the channel 106a or 106b.

This configuration will be described in more detail. When the channel selector 109 selects the first channel 106a, the first diode 105a connected to the first channel 106a is connected to the reverse voltage driver 103 through the first switch 104a. Therefore, when a reverse voltage is applied to the first diode 105a from the reverse voltage driver 103, the first λ/4 equivalent circuit 102a is non-grounded, and the impedance of a section from the first λ/4 equivalent circuit 102a to the first diode 105a becomes zero. Then, a voltage supplied from the plasma power supplier 101 is transmitted to the first channel 106a, and then transmitted to the first reactor 108a. In this case, since the reverse voltage is not applied to the second diode 105b connected to the second channel 106b, the second λ/4 equivalent circuit 102b is grounded, and the impedance of a section from the second λ/4 equivalent circuit 102b to the second diode 105b has an infinite value. Therefore, the voltage supplied from the plasma power supplier 101 is not transmitted to the second diode 105b and the second channel 106b.

Similarly, when the channel selector 109 selects the second channel 106b, the second diode 105b connected to the second channel 106b is connected to the reverse voltage driver 103 through the second switch 104b. Therefore, when a reverse voltage is applied to the second diode 105b from the reverse voltage driver 103, the second λ/4 equivalent circuit 102b is non-grounded, and the impedance of the section from the second λ/4 equivalent circuit 102b to the second diode 105b becomes zero. Then, the voltage supplied from the plasma power supplier 101 is transmitted to the second channel 106b and then transmitted to the second reactor 108b. In this case, since the reverse voltage is not applied to the first diode 105a connected to the first channel 106a, the first λ/4 equivalent circuit 102a is grounded, and the impedance of the section from the first λ/4 equivalent circuit 102a to the first diode 105a has an infinite value. Then, the voltage supplied from the plasma power supplier 101 is not transmitted to the first diode 105a and the first channel 106a.

The channel selector 109 of the deposition apparatus according to the exemplary embodiment of the present invention determines the impedance states of the equivalent circuits and the diodes which are connected to the respective channels, and determines whether or not to transmit plasma power to the respective reactors.

As such, the channel selector 109 may transmit plasma power to a desired reactor through a desired channel, and the plasma power transmission may be alternately performed in the respective reactors.

According to the exemplary embodiment of the present invention, the channel selector 109 selects any one of the two reactors 108a and 108b to supply plasma power, but the present invention is not limited thereto. According to another exemplary embodiment of the present invention, the channel selector 109 connected to two or more reactors may be applied.

A deposition method of the deposition apparatus according to the exemplary embodiment of the present invention will be described with reference to FIGS. 1 and 2.

At a first step, the first gas supply unit G1 supplies source gas to the first and third reactors R1 and R3 at the same time, and the second gas supply unit G2 continuously supplies only reactive purge gas to the second and fourth reactors R2 and R4. As the source gas is supplied to the first and third reactors R1 and R3, source gas molecules are adsorbed onto the substrates mounted in the first and third reactors R1 and R3. In this case, the source gas and the reactive purge gas may be supplied together. The reactive purge gas refers to gas which includes a component forming a final thin film, but serves as only purge gas without reacting with source gas when the reactive purge gas is inactivated, and reacts with the source gas when the reactive purge gas is activated (decomposed) by plasma. For example, $N_2$ is used as simple purge gas when inactivated, but used as a nitrogen source for forming nitride when activated by plasma.

At a second step, the supply of the source gas to the first and third reactors R1 and R3 is stopped, and the source gas molecules adsorbed onto the substrate and the source gas remaining in the reactors are continuously purged by the reactive purge gas. Simultaneously, the source gas is supplied to the second and fourth reactors R2 and R4 through the second gas supply unit G2 at the same time, and the reactive purge gas may be supplied together.

At a third step, plasma power is supplied to the first and third reactors R1 and R3 to which the reactive purge gas is being supplied. Specifically, the first plasma supply unit P1 supplies plasma power to the first reactor R1, and the second plasma supply unit P2 supplies plasma power to the third reactor R3. As the reactive purge gas supplied to the first and third reactors R1 and R3 is activated and decomposed by the plasma power, the reactive purge gas reacts with the source gas molecules adsorbed onto the substrate, thereby forming a desired thin film.

The supply of the plasma power is performed by the operation of the plasma supply unit 100 described with reference to FIG. 2. That is, the channel selector 109 of the first plasma supply unit P1 applies a reverse voltage to the diode connected to the first reactor R1, and the channel selector 109 of the second plasma supply unit P2 applies a reverse voltage to the diode connected to the third reactor R3. Then, the plasma power is applied to the first and third reactors R1 and R3.

At a fourth step, the supply of the source gas to the second and fourth reactors R2 and R4 is stopped, and the source gas molecules adsorbed onto the substrate and the source gas remaining in the reactors are purged while only the reactive purge gas is continuously supplied by the second gas supply unit G2.

At a fifth step, the first plasma supply unit P1 stops supplying plasma power to the first reactor R1, and supplies plasma power to the second reactor R2, and the second plasma supply unit P2 stops supplying plasma power to the third reactor R3, and supplies plasma power to the fourth reactor R4. Accordingly, as the reactive purge gas supplied to the second and fourth reactors R2 and R4 is activated and decomposed, the reactive purge gas reacts with the source gas molecules adsorbed onto the substrate, thereby forming a desired thin film.

The supply of the plasma power is performed by the operation of the plasma supply unit 100 described with reference to FIG. 2. That is, the channel selector 109 of the first plasma supply unit P1 stops applying a reverse voltage to the diode connected to the first reactor R1, and applies a reverse voltage to the diode connected to the second reactor R2, and the channel selector 109 of the second plasma supply unit P2 stops applying a reverse voltage to the diode connected to the third reactor R3, and applies a reverse voltage to the diode connected to the fourth reactor R4. Then, plasma power is applied to the second and the fourth reactors R2 and R4.

In this case, the reactive purge gas may be continuously supplied to the first and third reactors R1 and R3. The reactive purge gas supplied to the first and third reactors R1 and R3 serves only as purge gas and is not activated any more, because the plasma power is not supplied. Therefore, the reactive purge gas does not chemically react with the thin film which is already adsorbed onto the substrate, but simply purges only the remaining reactant gas.

At a sixth step, the reactive purge gas and the source gas are supplied to the first and third reactors R1 and R3 again. Further, the plasma power supplied to the second and fourth reactors R2 and R4 is stopped, and only the reactive purge gas is supplied to the second and fourth reactors R2 and R4. The reactive purge gas supplied to the second and fourth reactors R2 and R4 is not activated, because the plasma power is not supplied. Therefore, the reactive purge gas does not chemically react with the thin film which is already adsorbed onto the substrate, but simply purges only the remaining reactant gas.

Then, as the second to sixth steps are repeated, the PEALD process is performed in the plurality of reactors R1 to R4. The reactive purge gas may be supplied at the step where the reactant gas is supplied, or continuously supplied during the entire steps. The reactive purge gas may be continuously supplied to minimize a pressure change inside the reactors, which makes it possible to perform a stable process.

In the exemplary embodiment, the deposition process of the first and third reactors R1 and R3 is started before the deposition process of the second and fourth reactors R2 and R4, but the deposition process of the second and fourth reactors R2 and R4 may be started before the deposition process of the first and third reactors R1 and R3.

The deposition apparatus according to the exemplary embodiment includes the plasma supply unit including the equivalent circuits, the diodes, and the reverse voltage driver. Therefore, the switching time for alternately supplying plasma power to the plurality of reactors decreases, and the durability of operation characteristics increases. Therefore, it is possible to solve problems such as a short lifetime and frequent contact failures which may occur in the method using the conventional vacuum relay. Accordingly, it is possible to implement the PEALD process of which the productivity is enhanced.

Figure 3A:
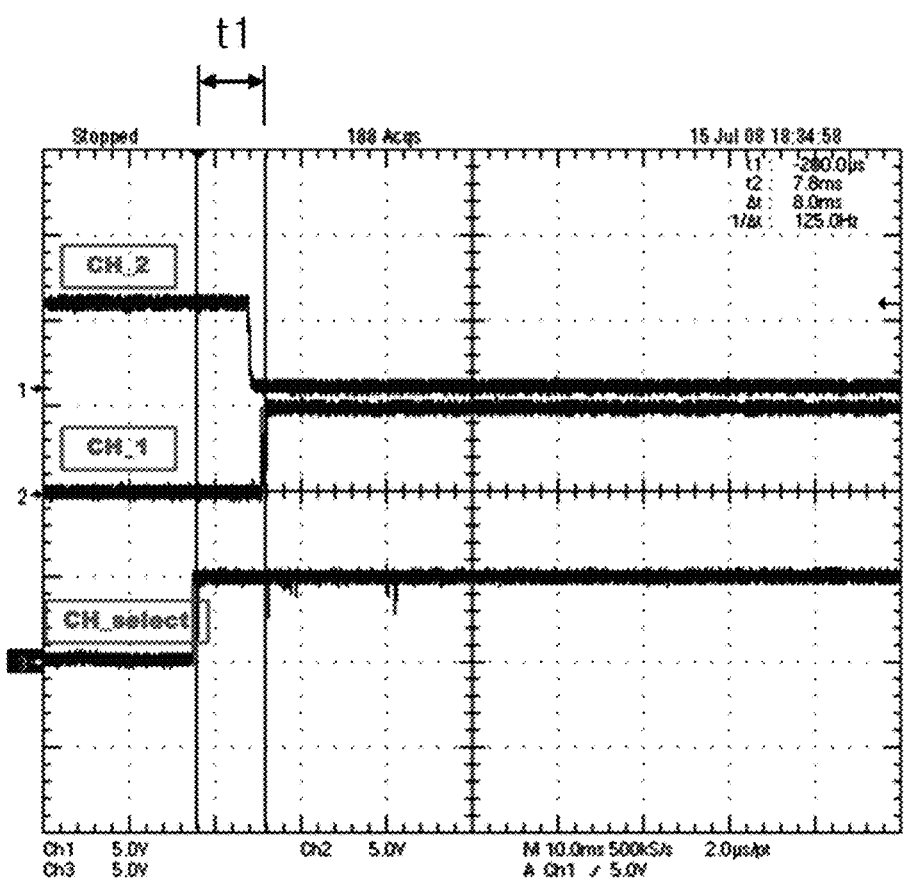
FIGS. 3A and 3B are graphs showing power switching results of the deposition apparatus according to experimental examples of the present invention.
Figure 3B:
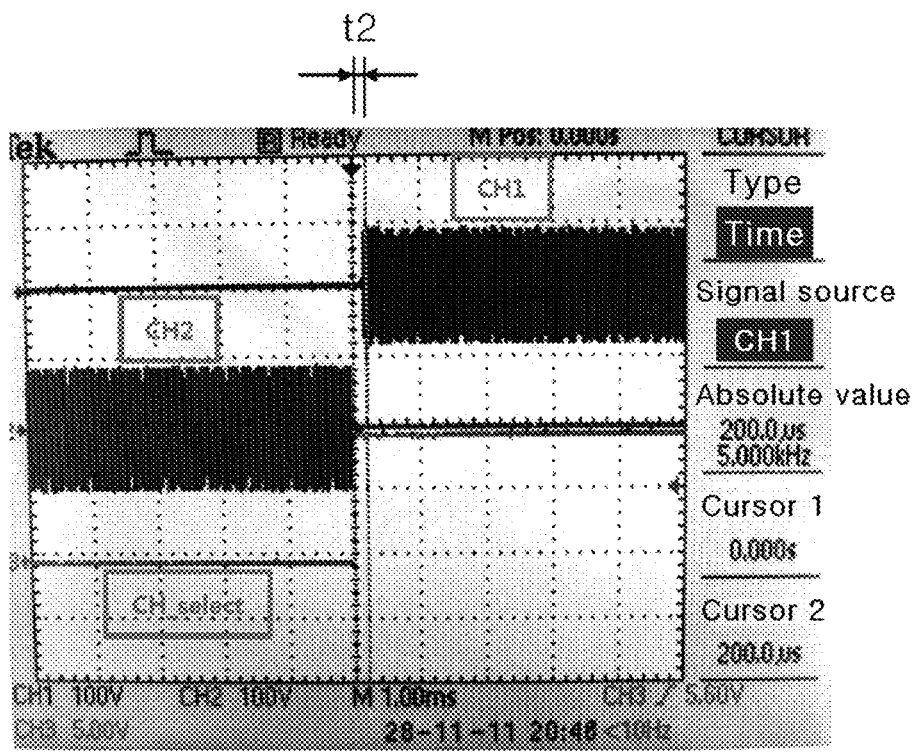

Then, referring to FIGS. 3A and 3B, power switching results of the deposition apparatus according to experimental examples of the present invention will be described. FIGS. 3A and 3B are graphs showing the power switching results obtained from the deposition apparatus according to the experimental examples of the present invention. FIG. 3A shows a result obtained by supplying plasma power to a plurality of reactors using the conventional vacuum relay, and FIG. 3B shows a result obtained by supplying plasma power to the plurality of reactors through the plasma supply unit using the diodes as in the deposition apparatus according to the exemplary embodiment of the present invention.

When the conventional vacuum relay is used, the switching time (t1) for each of the reactors is about 8 msec. However, when the plasma supply unit using the diodes according to the exemplary embodiment of the present invention is used, the switching time (t2) is 200 μsec. It can be seen that the switching time of the deposition apparatus according to the exemplary embodiment of the present invention becomes about 40 times shorter than the switching time of the conventional deposition apparatus.

As such, the deposition apparatus according to the exemplary embodiment of the present invention includes the plasma supply unit including the equivalent circuits, the diodes, and the reverse voltage driver. Therefore, the switching time for alternately supplying plasma power to the plurality of reactors decreases while the durability of the operation characteristic increases. Accordingly, it is possible to solve problems such as a short lifetime and frequent contact failures which may occur in the method using the conventional vacuum relay. As a result, it is possible to implement the PEALD process of which productivity is enhanced.

While this invention has been described in connection with what is presently considered to be practical exemplary embodiments, it is to be understood that the invention is not limited to the disclosed exemplary embodiments, but, on the contrary, is intended to cover various modifications and equivalent arrangements included within the spirit and scope of the appended claims.

What is claimed is:

1. A plasma enhanced atomic layer deposition (PEALD) method using a plurality of reactors, the method comprising the steps of:
   (a) preparing a deposition apparatus including a plurality of reactors including first to fourth reactors, a plurality of gas supply units including a first gas supply unit connected to the first and third reactors and a second gas supply unit connected to the second and fourth reactors, and a plurality of plasma supply units including a first plasma supply unit connected to the first and second reactors and a second plasma supply unit connected to the third and fourth reactors;
   (b) supplying source gas to the first and third reactors through the first gas supply unit;
   (c) supplying reactant gas to the first and third reactors through the first gas supply unit, and supplying source gas to the second and fourth reactors through the second gas supply unit;
   (d) applying a reverse voltage to a first diode of the first plasma supply unit connected to the first reactor to supply plasma power to the first reactor, and applying a reverse voltage to a third diode of the second plasma supply unit connected to the third reactor to supply plasma power to the third reactor;
   (e) supplying source gas to the first and third reactors through the first gas supply unit and supplying reactant gas to the second and fourth reactors through the second gas supply unit; and
   (f) applying a reverse voltage to a second diode of the first plasma supply unit connected to the second reactor to supply plasma power to the second reactor, and applying a reverse voltage to a fourth diode of the second plasma supply unit connected to the fourth reactor to supply plasma power to the fourth reactor.

2. The method of claim 1, wherein:
   the reactant gas comprises reactive purge gas, and
   the step (b) comprises further supplying the reactive purge gas together with the source gas.

3. The method of claim 2, wherein:
   the steps (c) to (f) are repeated a plurality of times.

4. The method of claim 1, wherein:
   the steps (c) to (f) are repeated a plurality of times.

5. The method of claim 1, further comprising:
supplying purge gas at one or more of between the steps (b) and (c), between the steps (c) and (d), between the steps (d) and (e), and between the steps (e) and (f).

6. The method of claim 1, wherein:
the reactant gas comprises reactive purge gas, and
the reactive purge gas is continuously supplied from the step (b) to the step (f).

7. The method of claim 1, wherein:
the first plasma supply unit further comprises a first plasma power supplier and first and second equivalent circuits connected between the first plasma power supplier and the first and second diodes, respectively;
the second plasma supply unit further comprises a second plasma power supplier and third and fourth equivalent circuits connected between the second plasma power supplier and the third and fourth diodes, respectively; and
the step (d) comprises converting a wavelength of power applied to the first plasma power supplier into $\lambda/4$ through the first equivalent circuit before applying the reverse voltage to the first diode, and converting a wavelength of power applied to the second plasma power supplier into $\lambda/4$ through the third equivalent circuit before applying the reverse voltage to the third diode.

8. The method of claim 7, wherein:
the step (f) comprises converting a wavelength of power applied to the first plasma power supplier into $\lambda/4$ through the second equivalent circuit before applying the reverse voltage to the second diode, and converting a wavelength of power applied to the second plasma power supplier into $\lambda/4$ through the fourth equivalent circuit before applying the reverse voltage to the fourth diode.

* * * * *